INVENTOR.
KERN K. N. CHANG
BY Joseph D. Black
ATTORNEY

INVENTOR.
KERN K.N. CHANG
BY Joseph D. Black
ATTORNEY 3,092,782

SOLID STATE TRAVELING WAVE PARAMETRIC AMPLIFIER

Kern K. N. Chang, Princeton, N.J., assignor to Radio Corporation of America, a corporation of Delaware
Filed Nov. 2, 1959, Ser. No. 850,258
2 Claims. Cl. 330—4.6)

The invention relates to traveling wave parametric devices, and particularly to a traveling wave parametric amplifier.

A problem encountered in the use of traveling wave parametric amplifiers is the backward wave reflection from the load which sets up reflected waves along the amplifier. These waves are undesired, introduce distortion, and greatly reduce the stability and efficiency of the amplifier. The reflection may be at least partially removed by non-reciprocal devices such as isolators, gyrators, and so on. Devices of this non-reciprocal type, however, add complexity to the amplifier and introduce their own disadvantages.

It is an object of the invention to provide an improved traveling wave parametric amplifier.

A further object is to provide a substantially distortionless, traveling wave parametric amplifier which is substantially matched to a constant resistive load under a wide range of operating conditions over a broad frequency range.

A still further object of the invention is to provide a novel, non-reflective traveling wave parametric amplifier made of an active transmission line.

The objects of the invention are accomplished by providing a traveling wave parametric amplifier which is composed of distributed inductance capacitance networks or sections of combined non-linear inductances and non-linear capacitances. The non-linear series inductance is so related to the non-linear shunt capacitance that the distributed transmission line formed by the distributed non-linear elements is substantially matched to a constant resistive load under a wide range of operating conditions over a wide frequency range. A substantially distortionless line is produced by the invention, providing a non-reflecting traveling wave parametric amplifier.

A more detailed description of the invention will now be given in connection with the accompanying drawing, wherein.

Figure 1:
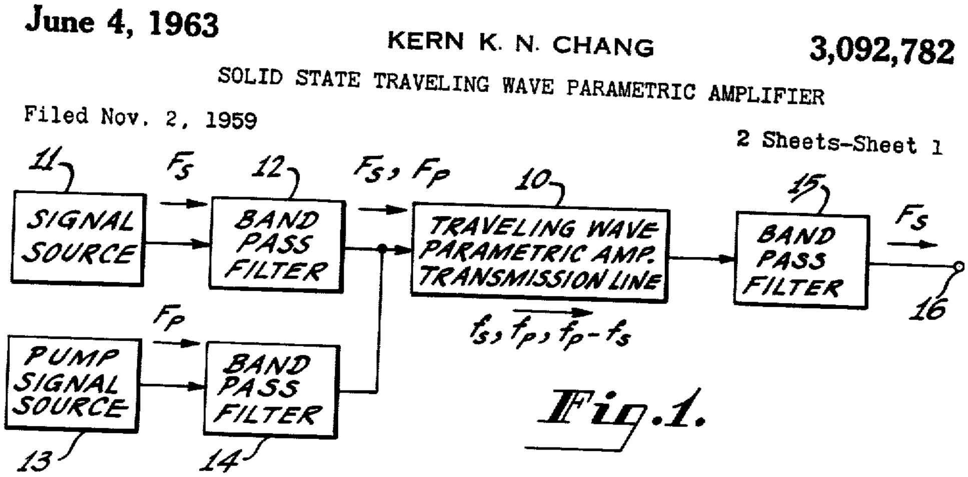
FIGURE 1 is a block diagram of a typical traveling wave parametric amplifier.

As shown in the block diagram of FIGURE 1, a typical traveling wave parametric amplifier includes a transmission line 10. The line 10 is derived from a low pass filter having series inductance and shunt capacitance. The filter is made into a traveling wave variable-reactance or parametric amplifier by replacing the usual shunt capacitors with non-linear, variable capacitance, semiconductor crystal diodes. A crystal diode is an attractive means of obtaining a non-linear capacitance, because it exhibits a marked variation of capacitance with applied voltage and is compact. A detailed discussion of the variable capacitance diode operation may be found in the literature.

Signal power at frequency $F_s$ is applied from a suitable source 11 through a band-pass filter 12 to one end of the line 10. Pump power at frequency $F_p$ is applied from a suitable source 13 through a band-pass filter 14 to the same one end of the line 10. The pump and signal frequency waves move past the succession of non-linear reactances represented by the diodes with substantially the same velocity and interact in the non-linear reactances. An idler frequency $F_I$, which is the pump frequency minus the signal frequency ($F_I=F_p-F_s$), is generated. The interaction of the pump, signal and idler frequency waves results in the amplification of the signal frequency wave in a manner to be described. In order to achieve adequate amplification, the signal frequency, the pump frequency and the idler frequency must be in the passband of the line 10. The upper side band, the signal having a frequency equal to the sum of the signal frequency and the pump frequency, may be in the stop band of the line 10. The amplified, signal frequency $F_s$ is taken from the line 10 and applied through a band-pass filter 15 to an output terminal 16. Since no resonant elements are involved, the amplifier can be made broadband.

Noise originating in the output circuit, in a following amplifier stage, for example, may be reflected to the input, can be amplified and then can return to the output enhanced by the gain of the amplifier. Isolators, gyrators, and so on, have been used to eliminate the reflected energy and to isolate the input and output circuits. While such devices provide a partial solution, these devices present their own disadvantages. They are themselves responsible for noise and may very well contribute more noise to the output than the amplifier itself. Furthermore, they are bulky and in some instances contribute 80 to 90 percent of the volume and weight of a parametric amplifier, and may introduce undesired losses.

The characteristic impedance of a line 10 as described above and including series inductances and non-linear shunt diode capacitances may be represented mathematically by the equation:

$$\sqrt{\frac{R+j\omega L}{-G+j\omega C}}$$

where R is the resistance of the line per unit length; G is the absolute value of the shunt conductance of the line per unit length; $j$ is the complex constant; $\omega$ is the operating frequency of the line; L is the inductance of the line per unit length; and C is the capacitance per unit length. The conductance $-G$ is negative in value so far as the alternating current components are concerned. Because the resistance R and conductance $-G$ are of different sign, it is not possible to match the line. It follows also that the characteristic or surge impedance of the line will vary as a function of the frequency $\omega$. Thus both reflection and distortion along the line result.

The presence of the reflected energy reduces the possibility of stable and low noise amplification. A traveling wave parametric amplifier transmission line constructed according to the invention and reducing or substantially eliminating the above-mentioned reflected energy, and therefore reducing or eliminating the need for input-output isolating devices, is shown in FIGURE 2.

Figures 2, 3:
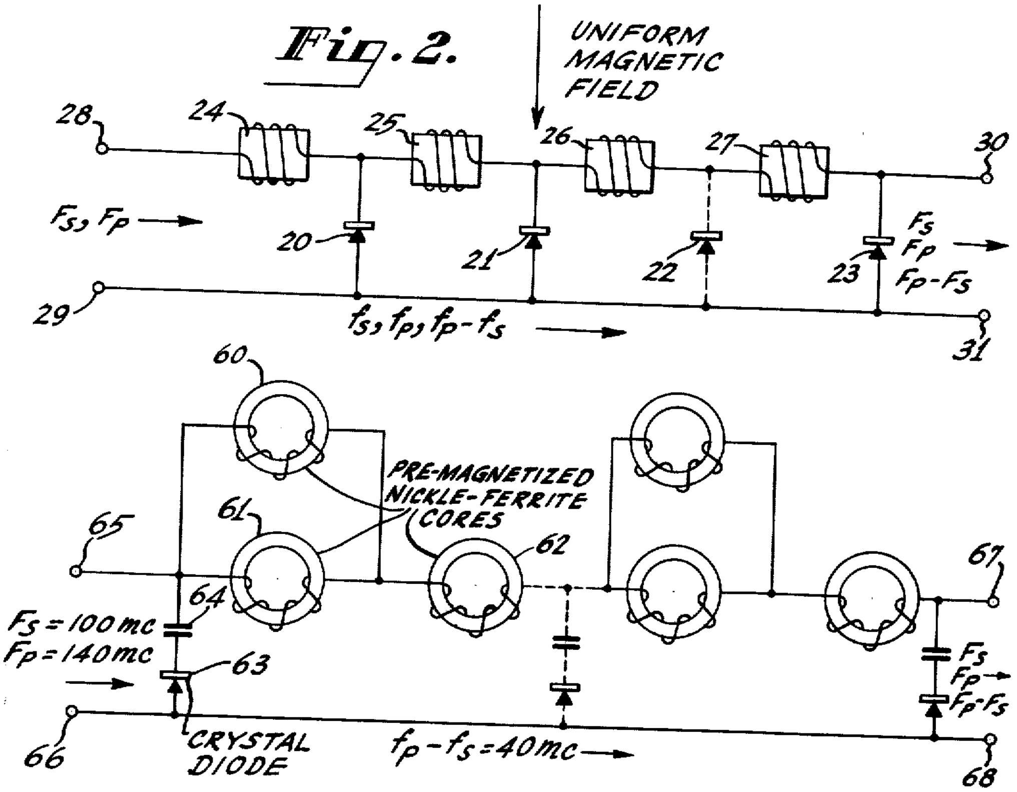
FIGURE 2 is a circuit diagram of one embodiment of a traveling wave parametric amplifier as taught by the invention.
FIGURE 3 is a schematic diagram illustrating one practical embodiment of a transmission line for a traveling wave parametric amplifier according to the invention.

The amplifier transmission line of FIGURE 2 includes non-linear shunt capacitances in the form of semi-conductor diodes 20, 21, 22 and 23. The diodes 20, 21, 22 and 23 may be germanium P-N junction diodes. According to the invention, the series inductances of the line are in the form of non-linear inductances 24, 25, 26 and 27. The inductances 24, 25, 26 and 27 are made of a core having a coil wound thereon. Garnet or a suitable ferrite material may be used for the core, for example. The non-linear inductances 24, 25, 26 and 27 are subjected to a uniform magnetic field in the direction of the arrow when necessary, as in the use of garnet, to provide the desired non-linear inductance values for the line. The pump and signal frequencies are applied from sources 11 and 13, as shown in FIGURE 1, to the input terminals 28, 29. The amplified signal frequency appearing at the output terminals 30, 31 is fed through a filter 15, as shown in FIGURE 1, to remove the pump and idler frequencies, the amplified signal frequency being fed to a utilization circuit.

The non-linear interaction of the non-linear shunt capacitances 20, 21, 22 and 23 and the non-linear series inductances produces, respectively, a negative conductance (−G) and a negative resistance (−R) of the line per unit length. That is, the conductance and resistance set forth in the above equation are of the same sign. Using the terms defined above, if the resistance and conductance are so related that $$\frac{-R}{L}=\frac{-G}{C}$$

then the above equation for the characteristic impedance of the line becomes $$\sqrt{\frac{L}{C}}\sqrt{\frac{\frac{-R}{L}+j\omega}{\frac{-G}{C}+j\omega}}=\sqrt{\frac{L}{C}}$$

The characteristic impedance of the amplifier is therefore nearly a constant, determined by the fixed part of the values of capacitance and inductance. In this connection, the major portion of the series inductance and the major portion of the shunt capacitance are constant or fixed in value. Since these fixed values are not a function of frequency, the impedance does not substantially vary as a function of frequency. A nearly distortionless or non-reflecting line is provided.

Each section of the amplifier is substantially matched impedancewise to the next section. The signal frequency wave looks into a matched line as it passes from one section to the next, and the line may be substantially matched to a fixed impedance load or load resistance at one or both of its terminations. Therefore, stable, low noise amplification is possible.

In considering the gain mechanism of a variable reactance amplifier as shown in FIGURE 2, the signal, pump and idler frequency waves move along the amplifier past the diodes 20, 21, 22 and 23 with the same velocity. Each diode will see, as a function of time, the same relationship between the frequencies. The presence of the negative conductance per unit length and the negative resistance per unit length results in energy being added to the signal frequency wave in each section of the line. By way of example, a signal frequency $F_s$ of 3000 megacycles and a pump frequency $F_p$ of 6800 megacycles are used. An idler frequency of 3800 megacycles results. The variable capacitance is driven at the sum of the signal and idler frequencies, resulting in energy being added to the signal frequency wave by the pump. As the signal frequency wave travels from section to section down the amplifier, it will assume an increased amplitude, having a gain factor that depends on the characteristics of the diodes, the characteristics of the inductors, and other characteristics. An amplified signal frequency $F_s$ is available at the output terminals 30, 31 for application to a utilization circuit.

The spacing between the diodes 20, 21, 22 and 23 should be as small as possible. Preferably, the diodes should be spaced not more than one-eighth of a wavelength at the operating frequency to present as smooth and continuous a line as is possible.

In certain embodiments, it may be desirable to have the signal frequency $F_s$ one-half the pump frequency $F_p$. Since in this case the idler frequency equals the signal frequency, the charge on the variable capacitance per unit length is a function of the signal frequency and not the sum of the idler and signal frequencies. To obtain amplification, the pump and signal frequencies must be applied to the amplifier in proper phase relationship which can be determined experimentally. The presence of the negative resistance per unit length and negative conductance per unit length results in additional electrical energy being stored in the diode, the additional energy manifesting itself as an increase in voltage across the diode. A corresponding increase in the signal frequency amplitude per section of the amplifier occurs. Since the pump and signal frequencies move along the amplifier with the same velocity, each diode will see the same phase relationship of pump and signal that every previous diode saw. An amplified signal frequency wave is available at the output terminals for application to a utilization circuit.

By utilizing the non-linear inductances 24, 25, 26 and 27 along with the non-linear capacitances 20, 21, 22 and 23, noise or other energy is not reflected back along the amplifier. The amplifier is composed of distributed L-C networks of combined non-linear inductances and non-linear capacitances. The non-linear inductance can be so related to the non-linear capacitance that the distributed transmission line formed by the distributed non-linear elements is matched to a constant resistive load under any operating conditions over a broad frequency range. Low noise, stable amplification up into the microwave frequency range is possible.

In traveling wave parametric amplifiers having active elements only in the shunt path, or only in the series path, the gain per section is limited. Any increase in the gain per section results in a correspondingly greater amplification per section of the reflections and undesired waves appearing in the amplifier. The noise characteristic of such an amplifier reduces its value and limits its practical use. By the arrangement of the invention, an amplifier is provided wherein the gain per section can be increased to 5 db or greater, for example. The use of the distortionless line provides a relatively low noise characteristic for the amplifier. An amplifier having high gain, low noise characteristics and at the same time the advantages of traveling wave operation is provided. Another way of looking at the invention is that the novel arrangement provides a line with less dispersion, and which is less frequency sensitive. Therefore, as is known, the phase-constant relationship of the pump, signal, and idler frequencies remains substantially unchanged as the waves travel along the line from sending to receiving end. Moreover, as the characteristic impedance of the line is now substantially fixed, a constant load resistance of fixed value may be employed to receive the amplified energy without the introduction of undesired reflections.

Reference has been made to the use of germanium P–N junction diodes for the non-linear capacitance 20, 21, 22, 23. Reference has also been made to a particular form of non-linear inductance. The invention is not to be considered as limited thereto. In practice, the non-linear series inductance and non-linear shunt capacitance may be formed by any known structure suitable for this purpose. Any semiconductor device which exhibits negative resistance can be used. For example, a germanium diode with extremely high doping concentration and having the tunnel effect has a negative resistance. This negative resistance can be utilized to realize either (−R) or (−G) of the active transmission line as desired.

While the amplifier of FIGURE 2 is shown as including four sections, the number of sections used may be greater, as indicated by the dotted lines, and may be determined according to the degree of amplification desired, and other factors.

An embodiment of the invention which was reduced to practice is given in FIGURE 3. The non-linear series inductance per section of the line was provided by three toroidal cores 60, 61 and 62 of nickel ferrite material having a coil connected in the series path of the line wound thereon. The cores were pre-magnetized to have a residual magnetization at that point of their hysteresis loops providing the best non-linear characteristic. The number of cores used and the manner of connecting them in the series path were determined to provide the desired total non-linear series inductance desired.

Since the capacitance value of the crystal diode 63 used in each section is limited by the characteristics of the diode itself, the desired value of total shunt capacitance was provided by placing additional capacitance in the form of a fixed capacitor 64 in series with the available diode 63 in the shunt path. In this manner, the total shunt capacitance is the combination of the fixed capacitance and the variable capacitance provided by the diode 63. If the diode 63 provides the total desired value of capacitance, the added capacitance is, of course, unnecessary.

A signal frequency of 100 megacycles and a pump frequency of 140 megacycles applied to the input terminals 65, 66 resulted in the amplification of the signal frequency. The amplified signal frequency was taken from the line via output terminals 67, 68.

In the embodiment of FIGURE 3, the diodes 63 were experimental germanium diodes rated at about 20 micromicrofarads at zero voltage bias. The fixed capacitors 64 were rated at 56 micromicrofarads, presenting a combined shunt capacitance per section of approximately 15 micromicrofarads. The cores 61, 62 and 63 were about one-quarter inch in diameter and each had three windings thereon. The total series inductance per section was in the order of .04 microhenry. The cores themselves were constructed with a content by weight of $NiFe_{1.92}$, $MN_{.08}O_4$. A fifty ohm impedance line resulted.

Figures 4, 5:
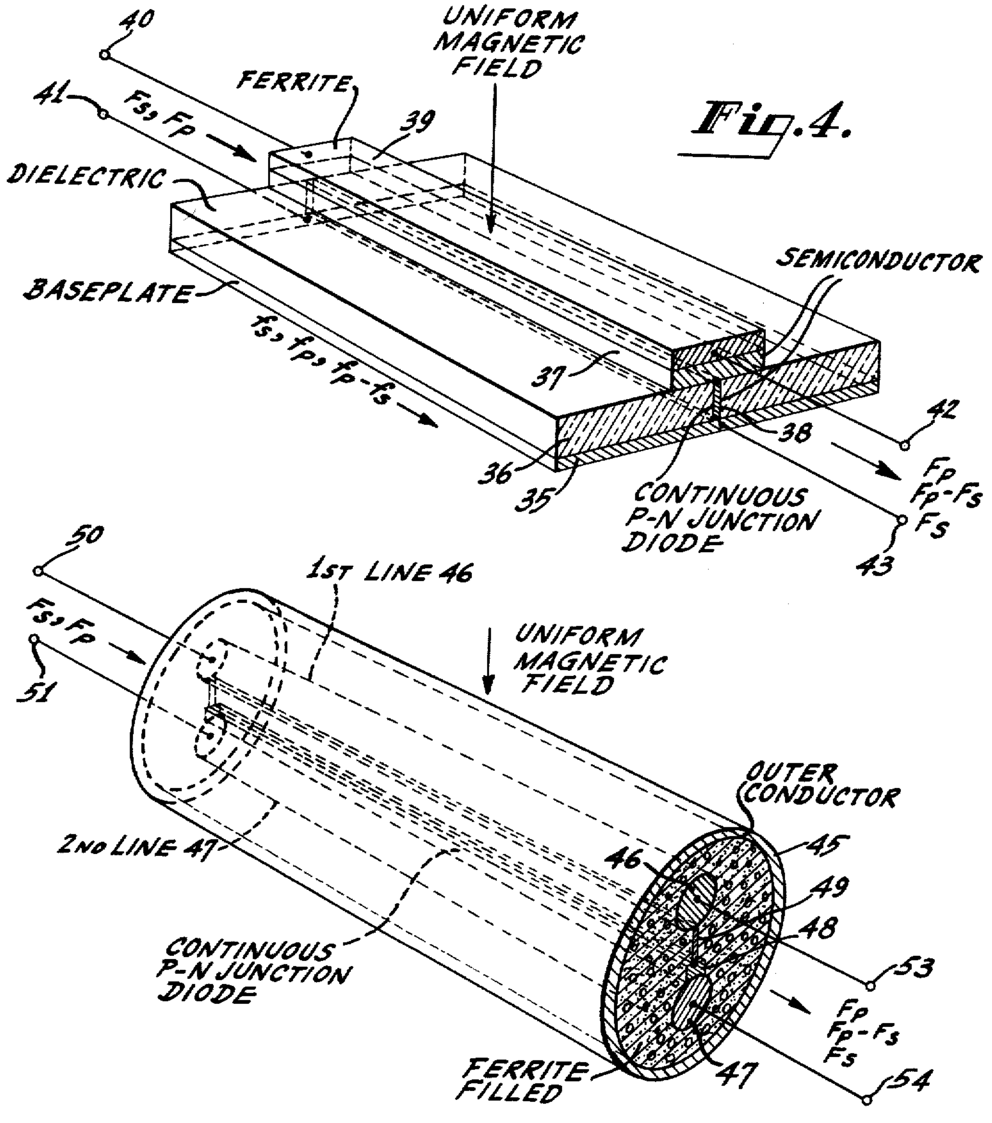
FIGURE 4 shows one example of a smooth, active transmission line constructed according to the invention and including a continuous non-linear series inductance and non-linear shunt capacitance.
FIGURE 5 shows a further example of a smooth, active transmission line constructed according to the invention and including a continuous non-linear series inductance and non-linear shunt capacitance.

FIGURE 4 shows one example of a smooth, active transmission line, traveling wave parametric amplifier constructed according to the invention. A continuous non-linear series inductance and shunt capacitance are used. The amplifier is constructed according to strip-line technique. A baseplate 35 which may be made of copper or other conductor is provided. A dielectric or insulator 36 made of glass or other commercially available product for example, Teflon, is positioned on one side of the baseplate 35. A continuous P–N junction diode made of germanium or other suitable semiconductor material is mounted along the length of the amplifier. The diode comprises a first continuous strip 37 of germanium, for example, of one type of conductivity mounted on the dielectric 36. A second continuous strip 38 of germanium, in the example given, of the opposite type of conductivity is positioned at right angles to the strip 37 and makes a continuous electrical contact between the diode and the baseplate 35 along the amplifier. A continuous junction diode or shunt capacitance is provided by the strips 37, 38. A strip 39 of material such as garnet exhibiting non-linear inductance is mounted on the strip 37. A uniform magnetic field may be applied in the direction of the arrow to provide the value of non-linear inductance desired. As shown, the strips 37, 39 may be of narrower dimensions than the dielectric 36 and baseplate 35, so long as a proper electrical current path is provided along the amplifier.

The pump and signal frequency waves are applied to one end of the amplifier via terminals 40, 41. Terminal 40 is connected to the strip 39, while terminal 41 is connected to the baseplate 35. The amplified signal frequency wave is taken between the strip 39 and the baseplate 35 at the other end of the amplifier via terminals 42, 43. The operation of the amplifier is similar to that set forth above in connection with FIGURE 2. The non-linear, continuous series inductance represented by strip 39 is related to the non-linear, continuous shunt capacitance represented by strips 37, 38 so that a distortionless, non-reflected traveling wave parametric amplifier is provided.

The actual dimensions of the amplifier can be determined according to the degree of amplification desired, the particular application, and so on. The dimensions of the diode strips 37, 38 have been exaggerated for purposes of illustration. In actual practice, the dimensions may be quite small relative to the remaining structure of the amplifier.

A further example of a smooth, active transmission line, traveling wave parametric amplifier constructed according to the invention is given in FIGURE 5. In this example, a two-line shield cable is used. The cable which may be one-half inch in diameter, for example, comprises an outer conductor 45. A first line 46 and a second line 47 of conducting material extend the length of the cable. A continuous junction diode is provided comprising strips 48, 49. One of the strips 48 is made of a semiconductor material such as germanium of one conductivity type and is in contact with the second line 47. The junction diode is completed by the second strip 49 of the semiconductor material of the opposite conductivity type. The strip 49 completes a connection between the diode and the first line 46.

The cable is filled with a ferrite material exhibiting non-linear inductance. A uniform magnetic field is provided in the direction of the arrow to obtain the desired value of non-linear inductance.

Energy of the signal frequency and energy of the pump frequency are applied from a suitable source between the first line 46 and the second line 47 via terminals 50, 51. The amplified signal frequency is taken between the first line 46 and the second line 47 via terminals 53, 54. Since the amplifier transmission line shown in FIGURE 5 is of a balanced nature, a balanced two-wire coaxial line input and/or output circuit may be used.

The non-linear series inductance represented by the ferrite material filling the cable and the non-linear shunt capacitance represented by the continuous diode 48, 49 are so related as to provide a distortionless line for the amplifier. The operation of the amplifier is similar to that set forth above in connection with FIGURE 2. The pump and signal frequency waves travel along the cable and interact to provide amplification of the signal frequency. Here, again, the junction diode has been exaggerated in size to permit illustration. In practice, the diode comprising strips 48, 49 can be quite small relative to the remaining structure.

While amplified energy of signal frequency is available at the output terminals, permitting the use of the invention as an amplifier, the idler or difference frequency is also available at the output terminals. An arrangement according to the invention may be used as a frequency converter by merely providing at the output a suitable filter or other means for passing only the idler frequency. In this latter use, the signal frequency and pump frequency are removed in the output circuit of the amplifier.

What is claimed is:

1. A traveling wave parametric amplifier comprising, in combination, an active transmission line including a baseplate of conducting material, a non-linear shunt capacitive reactance element in the form of a continuous P-N junction semiconductor diode mounted along one surface of said baseplate with the portion of said diode of one type of conductivity being in continuous electrical contact with said baseplate, a non-linear series inductive reactance element in the form of a strip of material mounted so as to be in continuous electrical contact with the portion of said diode of the other type of conductivity, means to apply a uniform magnetic field to said strip, the open area of said one surface of said baseplate being covered with a layer of insulating material, whereby said last-mentioned portion of said diode and said strip are insulated from said baseplate by said layer, means to apply energy of signal frequency and energy of pump frequency higher than said signal frequency between said strip and baseplate at one end of said line with the negative resistance and negative conductance produced by the non-linear interaction between said pump and signal frequencies in said inductive reactance element and said capacitive reactance element, respectively, being so related that $$\frac{-R}{L}=\frac{-G}{C}$$

where —R is the net resistance of the line per unit length, —G is the net shunt conductance of the line per unit length, L is the inductance of the line per unit length, and C is the capacitance per unit length, said line being characterized by a substantially constant characteristic impedance therealong, and means to derive an output signal between said strip and said baseplate at the other end of said line.

2. A traveling wave parametric amplifier comprising, an active transmission line including a section of cable having an outer conductor, second and third lines of conducting material extending in parallel along the length and internally of said cable, a non-linear shunt capacitive reactance element in the form of a continuous P-N junction semiconductor diode extending along the length of said section, the portion of said diode of one type of conductivity being in continuous electrical contact with said second line and the portion of said diode of the other type of conductivity being in continuous electrical contact with said third line, a non-linear series inductive reactance element in the form of a ferrite material filling the remaining internal area of said section, means for applying a uniform magnetic field to said material, means to apply energy of signal frequency and energy of pump frequency higher than said signal frequency between said second and third lines at one end of said section with the negative resistance and negative conductance produced by the non-linear interaction between said pump and signal frequencies in said inductive reactance element and said capacitive reactance element, respectively, being so related that $$\frac{-R}{L}=\frac{-G}{C}$$

where —R is the net resistance of the transmission line per unit length, —G is the net shunt conductance of the transmission line per unit length, L is the inductance of the transmission line per unit length, and C is the capacitance per unit length, said transmission line being characterized by a substantially constant characteristic impedance therealong, and means to derive an output signal between said second and third lines at the other end of said section.

References Cited in the file of this patent

UNITED STATES PATENTS

| | | |
|---|---|---|
| 2,727,945 | Prache | Dec. 20, 1955 |
| 2,742,613 | Sontheimer | Apr. 17, 1956 |
| 2,907,957 | Dewitz | Oct. 6, 1959 |
| 2,929,034 | Doherty | Mar. 15, 1960 |
| 3,008,089 | Uhlir | Nov. 7, 1961 |
| 3,012,203 | Tien | Dec. 5, 1961 |

UNITED STATES PATENT OFFICE

CERTIFICATE OF CORRECTION

June 4, 1963

Patent No. 3,092,782

Kern K. N. Chang

It is hereby certified that error appears in the above numbered patent requiring correction and that the said Letters Patent should read as corrected below.

Column 8, after line 31, insert the following:

OTHER REFERENCES

Tien et al.: "Proceedings of the IRE", April 1958, pages 700-706.

Signed and sealed this 7th day of January 1964.

(SEAL)
Attest:

ERNEST W. SWIDER

Attesting Officer

EDWIN L. REYNOLDS

Acting Commissioner of Patents